United States Patent
Bernstein et al.

(10) Patent No.: US 7,471,115 B2
(45) Date of Patent: *Dec. 30, 2008

(54) ERROR CORRECTING LOGIC SYSTEM

(75) Inventors: Kerry Bernstein, Underhill, VT (US);
Philip G. Emma, Danbury, CT (US);
John A. Fifield, Underhill, VT (US);
Paul D. Kartschoke, Williston, VT (US); William A. Klaasen, Underhill, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/926,386

(22) Filed: Oct. 29, 2007

(65) Prior Publication Data
US 2008/0048711 A1 Feb. 28, 2008

Related U.S. Application Data

(63) Continuation of application No. 10/710,641, filed on Jul. 27, 2004, now Pat. No. 7,336,102.

(51) Int. Cl.
*H03K 19/096* (2006.01)
*H03K 19/094* (2006.01)

(52) U.S. Cl. .................................. 326/95; 326/112

(58) Field of Classification Search ............... 326/8–11, 326/93, 95, 97, 112, 115, 119, 121; 327/144, 327/197–200, 208–212, 214–215, 224–225; 365/156, 189.05, 194
See application file for complete search history.

(56) References Cited

U.S. PATENT DOCUMENTS

| 4,394,763 A | 7/1983 | Nagano et al. |
|---|---|---|
| 4,688,219 A | 8/1987 | Takemae |
| 4,852,060 A | 7/1989 | Rockett, Jr. |
| 4,864,539 A | 9/1989 | Chuang et al. |
| 5,185,537 A | 2/1993 | Creedon et al. |
| 5,260,952 A | 11/1993 | Beilstein, Jr. et al. |
| 5,289,060 A | 2/1994 | Elnashar et al. |
| 5,379,302 A | 1/1995 | Andrews |

(Continued)

FOREIGN PATENT DOCUMENTS

EP 0147598 A1 7/1985

(Continued)

OTHER PUBLICATIONS

Rhyne, Fundamentals of Digital Systems Design, N.J. 1993 p. 70-71.*

*Primary Examiner*—Rexford Barnie
*Assistant Examiner*—Dylan White
(74) *Attorney, Agent, or Firm*—W. Riyon Harding; Hoffman Warnick LLC

(57) ABSTRACT

The invention includes an error correcting logic system that allows critical circuits to be hardened with only one redundant unit and without loss of circuit performance. The system provides an interconnecting gate that suppresses a fault in one of at least two redundant dynamic logic gates that feed to the interconnecting gate. The system is applicable to dynamic or static logic systems. The system prevents propagation of a fault, and addresses not only soft errors, but noise-induced errors.

8 Claims, 2 Drawing Sheets

U.S. PATENT DOCUMENTS

| | | | |
|---|---|---|---|
| 5,382,844 A * | 1/1995 | Knauer | 326/95 |
| 5,600,260 A | 2/1997 | LaMacchia et al. | |
| 5,644,583 A | 7/1997 | Garcia et al. | |
| 5,657,332 A | 8/1997 | Auclair et al. | |
| 5,701,313 A | 12/1997 | Purdham | |
| 5,864,654 A | 1/1999 | Marchant | |
| 6,049,899 A | 4/2000 | Auclair et al. | |
| 6,166,574 A | 12/2000 | Tao | |
| 6,321,366 B1 | 11/2001 | Tseng et al. | |
| 6,502,220 B1 * | 12/2002 | Durham et al. | 714/823 |
| 7,075,337 B2 * | 7/2006 | Wood et al. | 326/95 |
| 7,183,807 B2 * | 2/2007 | Seal et al. | 326/95 |
| 2003/0042933 A1 * | 3/2003 | Hill et al. | 326/95 |
| 2007/0103194 A1 * | 5/2007 | Erstad | 326/41 |

FOREIGN PATENT DOCUMENTS

| | | |
|---|---|---|
| JP | 6216756 A | 8/1994 |

* cited by examiner

US 7,471,115 B2

ERROR CORRECTING LOGIC SYSTEM

CROSS REFERENCE TO RELATED APPLICATIONS

This application is a continuation application of U.S. patent application Ser. No. 10/710,641, filed on Jul. 27, 2004 now U.S. Pat. No. 7,336,102.

BACKGROUND OF THE INVENTION

1. Technical Field

The present invention relates generally to integrated circuits, and more particularly, to an error correcting logic system.

2. Related Art

As integrated circuits (IC) have continued to diminish in size, they have become more sensitive to radiation induced soft errors. A "soft error" is an interruption of a circuit in the absence of any manufacturing defects and results in a false or invalid output even with stable inputs. Soft errors are sometimes referred to as single event upsets (SEU) and usually are associated with an SRAM cell where a single radiation event can cause the cell to be upset and hold the incorrect data. These radiation events can come from alpha ($\alpha$) particles from decaying lead present in package interconnects, or from cosmic radiation from deep space. The incidence of a radiation event causes an injection of current on the nodes of integrated circuits. The amount of charge to cause a circuit failure due to this injected current is called the critical charge (Qcrit). As ICs continue to scale in size, the Qcrit of circuits is becoming smaller and more circuits are becoming sensitive to radiation events. This includes circuits such as latches, register files and dynamic logic systems. Dynamic logic systems have also found increased usage because they are faster in some implementations. However, such systems are more unstable than static systems, and also more susceptible to soft error-induced and other types of electrical faults. One reason these systems are more unstable and fault intolerant is that faults propagate through them very easily because opposing currents are minimized to enhance performance. Once an error occurs in a dynamic logic system, the system is not recoverable as in a static circuit.

A common approach to addressing soft errors is the development of fault tolerant system designs that employ redundant or spare logic units. In one such approach, a system is designed to include at least three identical logic units, which operate in parallel, and the respective outputs of the units are polled to determine the correct output data. Specifically, if the results of the poll reveal that at least two of the three units output majority data, then such identical data is assumed correct. While this approach will provide relatively accurate output data, the approach is disadvantageous because it requires employing at least three separate redundant units, each designed to output the same data. Further, this approach adds size and power to the overall design. In addition, this approach does not address the extremely rapid propagation of a fault through the IC.

In another approach, a fault tolerant system employs only two units, which operate in parallel. In this system, the respective outputs of the two units are compared, and if they do not match, then a known signature is employed through both systems in an attempt to determine the correct and faulty outputs. This system is also disadvantageous in that several clock cycles must be performed when the unit outputs do not match, thereby decreasing the operating throughput of the system. This approach also does not address the extremely rapid propagation of a fault through the IC.

In view of the foregoing, there is a need in the art for an error correcting logic system that does not suffer from the problems of the related art.

SUMMARY OF THE INVENTION

The invention includes an error correcting logic system that allows critical circuits to be hardened with only one redundant unit and with minimum loss of circuit performance. The system provides an interconnecting gate that suppresses a fault in one of at least two redundant dynamic logic gates that feed to the interconnecting gate. The system is applicable to dynamic or static logic systems. The system prevents propagation of a fault, and addresses not only soft errors, but noise-induced errors.

A first aspect of the invention is directed to an error correcting logic system comprising: at least two redundant dynamic logic gates, each dynamic logic gate outputting one of a first logic state and a second logic state, the second logic state being output in response to a logic input signal; and an interconnecting gate coupled to an output of each redundant dynamic logic gate, the interconnecting gate outputting the second logic state only when all of the redundant logic gates output the second logic state.

A second aspect of the invention is directed to an error correcting logic system comprising: first means for outputting one of a first logic state and a second logic state, the second logic state being output in response to a logic input signal; second means for outputting one of the first logic state and the second logic state, the second logic state being output in response to the logic input signal; and third means for interconnecting outputs of the first means and the second means, and for correcting a fault by outputting the second logic state only when both the first means and the second means output the second logic state.

A third aspect of the invention is directed to a method for correcting a fault in a logic system, the method comprising: providing a first dynamic logic gate; providing a second dynamic logic gate that is redundant to the first dynamic logic gate; and combining outputs of the first and second dynamic logic gates to correct a fault in one of the first dynamic logic gate and the second dynamic logic gate.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
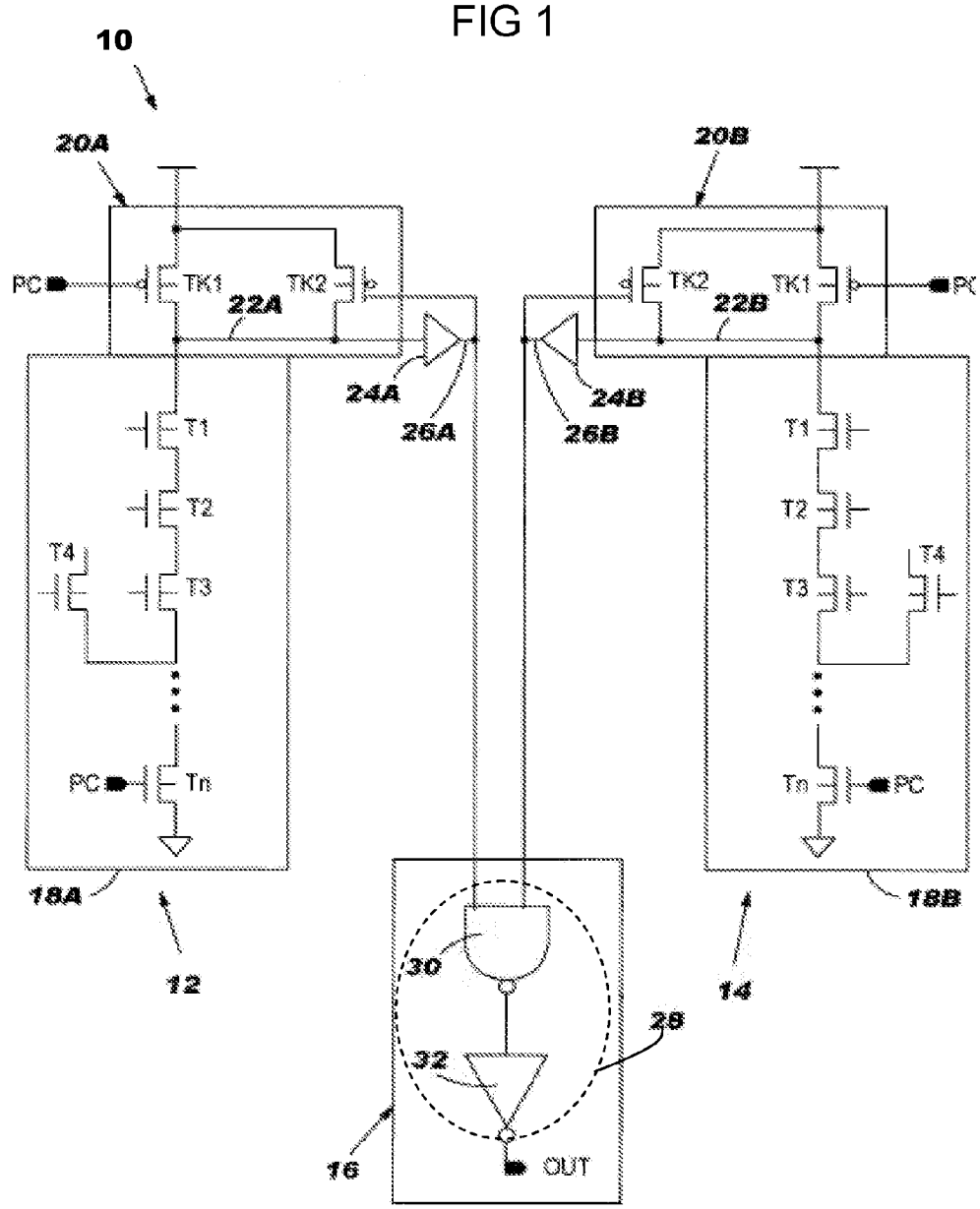
FIG. 1 shows a first embodiment of an error correcting logic system of the invention.

With reference to the accompanying drawings, FIG. 1 shows an error correcting logic system 10 according to a first embodiment of the invention. System 10 includes a first dynamic logic gate 12 (hereinafter "DLG"), a second DLG 14, which is identical to first DLG 12, and an interconnecting gate 16 connected to receive the outputs of both DLGs 12, 14. A DLG, generally, outputs a first logic state that is generated by pre-charging of a node, and either maintains that first logic state or changes it to a second logic state in response to a logic input signal. For purposes of description, each dynamic logic gate has been illustrated as a cascode voltage switch (hereinafter "CVS"). It should be recognized, however, that the teachings of the invention are applicable to a variety of dynamic logic systems or mechanisms for evaluating a logic input signal. It should also be recognized that while two DLGs 12,14 have been illustrated, the invention may include any number of DLGs 12,14 feeding to an interconnecting gate 16. Interconnecting gate 16 is selected to correct a fault by outputting the second logic state only when all of DLGs 12, 14 output the second logic state. Interconnecting gate 16 also prevents propagation of a fault caused by an erroneous change from the first logic state, as will be described further below.

Each DLG 12,14 includes a combinatorial logic section 18A, 18B and a pre-charge section 20A, 20B that are connected to form a critical node 22A, 22B. Each critical node 22A, 22B is coupled to a respective inverting gate 24A, 24B. Outputs 26A, 26B of each inverting gate 24A, 24B are coupled to interconnecting gate 16. Each DLG 12,14 is of a non-differential output type. Interconnecting gate 16, in this embodiment, is provided in the form of a static AND gate 28. In one embodiment, AND gate 28 is implemented with a NAND gate 30 and an inverting gate 32 for ease of construction. Obviously, AND gate 28 could also be constructed with other configurations of static logic, if so desired.

The operation of DLG 12, 14 will now be described with reference to FIG. 1. Each combinatorial logic sections 18A, 18B can provide any type of combinatorial or Boolean logic, e.g., AND, NAND, NOR, XNOR, etc. In the example shown, combinatorial logic sections 18A, 18B each include a series of n-FET transistors T1-Tn, where n is an integer. Each DLG 12,14 is pre-conditioned HIGH by use of a pre-charge device TK1 (discussed below). Accordingly, if a combinatorial section 18A, 18B conducts from critical node 22A, 22B to ground, it changes the state of the output 26A, 26B from LOW to HIGH based on critical nodes 22A, 22B changing from HIGH to LOW. Otherwise, outputs 26A, 26B remain LOW based on the pre-conditioned HIGH on critical nodes 22A, 22B.

With reference to pre-charge sections 20A, 20B, the sections are provided, as known in the art, to pre-condition critical nodes 22A, 22B in a HIGH state. That is, pre-charge sections 20A, 20B provide adequate charge to place critical nodes 22A, 22B in a HIGH state. Each pre-charge section 20A, 20B includes a first p-FET TK1 (referred to herein as a "pre-charge device") and may include a second, weaker p-FET TK2 (referred to herein as a "keeper device") for maintaining the charge by counteracting diffusion and sub-threshold leakage from transistors T1, T2, etc. By design, keeper devices TK2 are implemented as low current devices, and are not of sufficient strength to offset charge loss from exposure to an a particle. It should be recognized that keeper devices TK2 are not essential to operation of system 10. In operation, each pre-charge device TK1 (and transistor Tn) receives a pre-charge PC. Typically, pre-charge PC is pulsed to ground prior to evaluation of system 10, which allows pre-charge device TK1 to conduct. As a result, current flows into critical nodes 22A, 22B and forces keeper devices TK2 to conduct via inverting gate 24A, 24B. This activity forces critical nodes 22A, 22B to be charged and maintained HIGH. That is, when pre-charge PC is removed, the HIGH level charge is maintained on critical nodes 22A, 22B by keeper devices TK2. As a result, diffusion leakage does not alter the logic level of outputs 26A, 26B.

The operation of system 10 will now be described. In order to correct a fault, the invention takes advantage of a statistical improbability of a single event upset fault, such as a soft error, affecting more than one DLG 12,14 at one time. That is, the invention relies on the predominant fault type generating an asymmetrical erroneous discharge from the pre-charge state. In other words, the invention assumes that an a particle is not large enough to affect more than one DLG. The invention also relies on the fact that a single event upset will drain the charge from critical nodes 22A, 22B towards ground, the polarity of the IC substrate. Accordingly, the invention prevents a negative fault on critical nodes 22A, 22B from propagating through to create a false HIGH level on node OUT.

Relative to error correction, the truth table indicating the possible outcomes for AND gate 28 follows.

| Output 26A | Output 26B | AND OUTPUT |
|---|---|---|
| High | High | High |
| Low | High | Low |
| High | Low | Low |
| Low | Low | Low |

As indicated in the table, any negative fault (i.e., one that changes the charge from the normal pre-charged HIGH on critical nodes 22A, 22B) that affects a single DLG 12, 14 is suppressed by interconnecting gate 16. The type of static logic gate used is chosen such that only when all of its inputs are in the logic state corresponding to the discharge state will the output change. (An OR gate will not correct this situation). Accordingly, any fault that causes a single critical node 22A, 22B to go LOW when it should be HIGH, which results in a single output 26A, 26B going HIGH when it should be LOW, is overcome by the combination of outputs 26A, 26B in AND gate 28. That is, only when both critical nodes 22A, 22B go LOW and, accordingly, both outputs 26A, 26B go HIGH, does system 10 output a HIGH signal. The unaffected DLG output assures the proper signal is outputted. In addition, interconnecting gate 16 prevents a single fault from propagating through other circuitry because two negative faults (highly improbable) would be required to allow AND gate 28 to output a fault.

Figure 2:
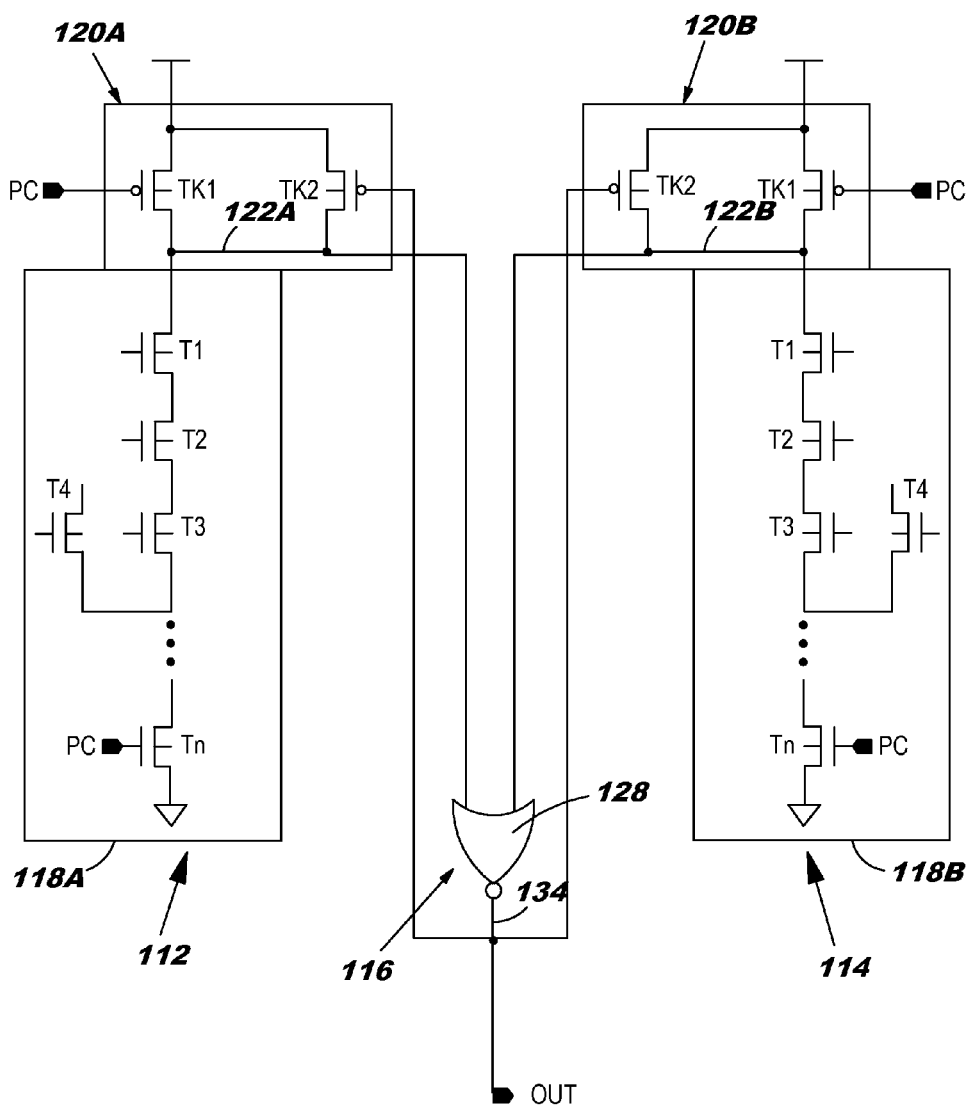
FIG. 2 shows a second embodiment of an error correcting logic system of the invention.

Referring to FIG. 2, an error correcting logic system 110 according to a second embodiment of the invention is shown. System 110 includes a first DLG 112, a second DLG 114, which is identical to first DLG 112, and an interconnecting gate 116 connected to receive the outputs of both switches 112, 114. Each DLG 112, 114 includes a combinatorial logic section 118A, 118B and a pre-charge section 120A, 120B that are connected to form a critical node 122A, 122B, respectively. Again, DLG 112 and DLG 114 are each of a non-differential output type, and each critical node 122A, 122B is pre-charged HIGH. Further, it should be recognized that while two DLGs 112, 114 have been illustrated, the invention may include any number of DLGs 112, 114 feeding to inter-connecting gate 116. Each critical node 122A, 122B is coupled to a respective input of interconnecting gate 116 in the form of a NOR gate 128. Combinatorial sections 118A, 118B and pre-charge sections 120A, 120B are substantially identical to those described relative to FIG. 1, except that the inverting gates have been removed and an output 134 of NOR gate 128 is fed back to control keeper devices TK2 of each pre-charge section 120A, 120B. Since the inverting gates of FIG. 1 have been removed, the embodiment of FIG. 2 provides a density advantage over the FIG. 1 embodiment.

The truth table indicating the possible outcomes for NOR gate 128 of FIG. 2 follows.

| Critical Node 122A | Critical Node 122B | NOR OUTPUT |
|---|---|---|
| High | High | Low |
| Low | High | Low |
| High | Low | Low |
| Low | Low | High |

As indicated in the above table, NOR gate 128 of FIG. 2 suppresses any negative fault that affects a single DLG 112, 114, i.e., one that changes the charge from the normal pre-charged HIGH on one of critical nodes 122A, 122B. Any fault that causes a single critical node 122A, 122B to go LOW when it should be HIGH, is overcome by the combination of these nodes 122A, 122B. Only when both DLG 112 and DLG 114 show a LOW output will system 110 output a HIGH signal. In addition, interconnecting gate 116 prevents a fault from propagating through other circuitry via the suppression.

The invention has been described relative to reducing a soft error rate (SER) of a CVS-type dynamic logic system. It should be recognized, however, that the invention is equally applicable to improve noise-induced errors. For example, the invention would work equally well to guard against electrical noise-induced faults such as a glitch on one of combinatorial section transistors T1-Tn as caused by line-to-line coupling, power supply noise or a fault from a previous stage. In addition, it should be recognized that the invention is also applicable to other types of dynamic logic systems other than a CVS.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims. For example, interconnecting gate 16, 116 could also be provided using a dynamic logic gate of a type that will output the second (discharged) logic state of the DLGs 12, 14 only when all of the DLGs output the second logic state.

What is claimed is:

1. An error correcting logic system comprising:
    first means for outputting one of a first logic state and a second logic state, the second logic state being output in response to a logic input signal;
    second means for outputting one of the first logic state and the second logic state, the second logic state being output in response to the logic input signal; and
    third means for interconnecting outputs of the first means and the second means, and for correcting a fault by outputting the second logic state only when both the first means and the second means output the second logic state,
    wherein the third means includes a NOR gate; wherein the first and second logic state includes a combinatorial logic section and a pre-charge section having a pre-charge device and a keeper device such that an output of the NOR gate feeds back to the keeper device.

2. A method for correcting a fault in a logic system, the method comprising:
    providing a first dynamic logic gate;
    providing a second dynamic logic gate that is redundant to the first dynamic logic gate;
    combining outputs of the first and second dynamic logic gates to correct a fault in one of the first dynamic logic gate and the second dynamic logic gate, the combining including interconnecting outputs of the first and second dynamic logic gates with a NOR gate; and
    providing a combinatorial logic section and a pre-charge section in each of the first and second dynamic logic gates, the combinatorial logic section and the pre-charge section connecting to form a critical node, the pre-charge section including a pre-charge device and a keeper device,
    wherein the critical node is maintained at a high level charge through the keeper device and the output of the NOR gate feeds back to the keeper device.

3. The method of claim 2, wherein the combining includes interconnecting outputs of the first and second dynamic logic gates with an AND gate.

4. The method of claim 3, wherein the AND gate includes a NAND gate coupled to an inverting gate.

5. The method of claim 2, wherein the combining includes interconnecting outputs of the first and second dynamic logic gates with a NOR gate.

6. The method of claim 2, wherein each dynamic logic gate is a cascode voltage switch.

7. The method of claim 2, wherein the fault is a soft error.

8. The method of claim 2, wherein the combining includes interconnecting outputs of the first and second dynamic logic gates with a static gate.

* * * * *